(12) United States Patent
Berger et al.

(10) Patent No.: US 6,638,004 B2
(45) Date of Patent: Oct. 28, 2003

(54) ARTICLE HOLDERS AND ARTICLE POSITIONING METHODS

(75) Inventors: Alexander J. Berger, Palo Alto, CA (US); Frank E. Kretz, Santa Clara, CA (US); Sean A. Casarotti, Morgan Hill, CA (US)

(73) Assignee: Tru-Si Technologies, Inc., Sunnyvale, CA (US)

(*) Notice: Subject to any disclaimer, the term of this patent is extended or adjusted under 35 U.S.C. 154(b) by 4 days.

(21) Appl. No.: 09/904,700

(22) Filed: Jul. 13, 2001

(65) Prior Publication Data

US 2003/0012638 A1 Jan. 16, 2003

(51) Int. Cl.[7] ............................................... B25J 15/00
(52) U.S. Cl. ...................... 414/800; 294/64.3; 414/941; 901/30
(58) Field of Search ................. 414/941, 806, 414/800, 744.8, 752.1; 901/30; 294/64.3, 64.1

(56) References Cited

U.S. PATENT DOCUMENTS

| | | | |
|---|---|---|---|
| 3,438,668 A | 4/1969 | Olsson et al. ............. 294/64.3 |
| 3,945,505 A | 3/1976 | Frisbie et al. ............ 214/1 BB |
| 4,029,351 A | 6/1977 | Apgar et al. .................. 294/64 |
| 4,257,637 A | * 3/1981 | Hassan et al. ............. 294/64.3 |
| 4,566,726 A | 1/1986 | Correnti et al. ............ 294/64.3 |
| 4,773,687 A | 9/1988 | Bush et al. ................. 294/64.1 |
| 4,852,926 A | * 8/1989 | Littell ....................... 294/64.1 |
| 4,931,341 A | * 6/1990 | Haffer et al. ............... 294/64.1 |
| 5,004,399 A | 4/1991 | Sullivan et al. .............. 414/729 |
| 5,044,752 A | 9/1991 | Thurfjell et al. ............. 356/400 |
| 5,169,196 A | 12/1992 | Safabakhsh ................. 294/64.3 |
| 5,324,155 A | * 6/1994 | Goodwin et al. ....... 294/64.3 X |
| 5,375,291 A | 12/1994 | Tateyama et al. ............. 15/302 |
| 5,445,486 A | 8/1995 | Kitayama et al. ............ 414/416 |
| 5,452,078 A | 9/1995 | Cheng ......................... 356/150 |
| 5,456,179 A | 10/1995 | Lamelot ...................... 102/213 |
| 5,540,098 A | 7/1996 | Ohsawa ....................... 73/629 |
| 5,546,179 A | 8/1996 | Cheng ......................... 356/73 |
| 5,556,147 A | 9/1996 | Somekh et al. ............. 294/64.1 |
| 5,622,400 A | 4/1997 | George ....................... 294/64.1 |
| 5,647,626 A | 7/1997 | Chen et al. ................. 294/87.1 |
| 5,669,752 A | 9/1997 | Moon .......................... 414/783 |
| 5,702,228 A | * 12/1997 | Tamai et al. ............... 414/744.5 |
| 5,746,460 A | 5/1998 | Marohl et al. ............... 294/1.1 |
| 5,765,889 A | 6/1998 | Nam et al. ................. 294/64.1 |
| 5,863,170 A | 1/1999 | Boitnott et al. ............. 414/222 |
| 5,870,488 A | 2/1999 | Rush et al. ................. 382/151 |
| 5,967,578 A | 10/1999 | Frey ........................... 294/64.3 |
| 6,013,920 A | 1/2000 | Gordon et al. ......... 250/559.36 |
| 6,095,582 A | 8/2000 | Siniaguine et al. ......... 294/64.3 |
| 6,099,056 A | 8/2000 | Siniaguine et al. ......... 294/64.3 |
| 6,109,677 A | 8/2000 | Anthony ................... 294/103.1 |
| 6,113,165 A | 9/2000 | Wen et al. .................... 294/1.1 |
| 6,139,678 A | 10/2000 | Siniaguine .................. 156/345 |

(List continued on next page.)

FOREIGN PATENT DOCUMENTS

| | | | |
|---|---|---|---|
| JP | 404341438 | 11/1992 | .............. 294/64.3 |
| WO | WO97/16847 | 9/1997 | |

OTHER PUBLICATIONS

Burg et al., "Orienting Bernoulili Effect Wafer Transfer Mechanism," Nov. 1975 IBM Technical Disclosure Bulletin, vol. 18, No. 6.

*Primary Examiner*—Donald W. Underwood
(74) *Attorney, Agent, or Firm*—Michael Shenker; MacPherson Kwok Chen & Heid LLP

(57) ABSTRACT

An article holder has protrusions that contact the article. The friction between the protrusions and the article impedes the article movement relative to the holder yet allows the article to slide when the article is pushed against some object. The article is pushed against the object in order to position the article more precisely.

35 Claims, 4 Drawing Sheets

U.S. PATENT DOCUMENTS

| | | |
|---|---|---|
| 6,164,894 A | 12/2000 | Cheng ........................ 414/416 |
| 6,168,697 B1 | 1/2001 | Siniaguine et al. .... 204/298.15 |
| 6,174,011 B1 | 1/2001 | Keigler ...................... 294/99.1 |
| 6,176,023 B1 | 1/2001 | Doche ......................... 34/451 |
| 6,183,026 B1 | 2/2001 | Cai et al. ................... 294/64.1 |
| 6,183,183 B1 | 2/2001 | Goodwin et al. ........... 414/217 |
| 6,184,060 B1 | 2/2001 | Siniaguine ................. 438/106 |
| 6,187,103 B1 | 2/2001 | Huang et al. ............... 118/728 |
| 6,198,976 B1 | 3/2001 | Sundar et al. ................ 700/59 |
| 6,199,927 B1 | 3/2001 | Shamlou et al. ........... 294/64.1 |
| 6,202,482 B1 | 3/2001 | Blew et al. .................... 73/159 |
| 6,206,441 B1 | 3/2001 | Wen et al. .................... 296/1.1 |
| 6,217,034 B1 | 4/2001 | Smedt et al. ................ 279/106 |
| 6,220,808 B1 | 4/2001 | Bonora et al. ............... 414/217 |
| 6,244,641 B1 | 6/2001 | Szapucki et al. .......... 294/64.1 |
| 6,305,898 B1 * | 10/2001 | Yamagishi et al. ...... 414/744.5 |
| 6,427,991 B1 | 8/2002 | Kao ............................ 269/21 |
| 2002/0185230 A1 | 12/2002 | Kao ...................... 156/345.53 |

* cited by examiner

ARTICLE HOLDERS AND ARTICLE POSITIONING METHODS

BACKGROUND OF THE INVENTION

The present invention relates to handling of semiconductor wafers and other articles.

In a typical integrated circuit manufacturing process, semiconductor wafers are handled by a computer controlled robot. The robot is required to position the wafers with much precision to avoid wafer damage or misalignment between different processing stages. A wafer can be damaged, for example, if it is unintentionally rubbed against a wall of a storage container into which the wafer is being lowered by the robot.

Absolute precision is impossible to achieve. Usually there are some errors in the wafer's position relative to the robot and the robot's position relative to a target station into which the wafer is placed by the robot.

SUMMARY

Some embodiments of the present invention allow one to reduce or eliminate the impact of wafer positioning errors. In some embodiments, the robot's wafer holder ("end effector") is constructed to allow the wafer to slide relative to the holder without the holder losing control of the wafer. For example, the holder may have protrusions on its surface. The robot generates a force that draws the wafer to the holder so that the wafer is pressed against the protrusions. The friction force between the wafer and the protrusions prevents the wafer from moving relative to the holder when the robot is transporting the wafer between stations, but allows the wafer to slide on the protrusions when the robot pushes the wafer against a pin or pins precisely positioned relative to a target station. The pin or pins steer the wafer into a precise position relative to the target station even though the holder position relative to the target station may be imprecise. The robot then places the wafer into the target station.

The invention is not limited to the embodiments described above, but is defined by the appended claims.

DESCRIPTION OF PREFERRED EMBODIMENTS

Figure 1:
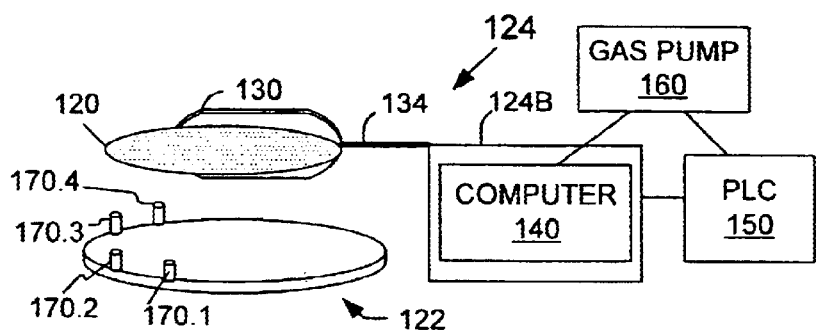
FIG. 1 is a perspective view of an article handling system according to one embodiment of the present invention.

In FIG. 1, an article 120 is being placed onto a target station 122 by a robot 124. For the purpose of illustration, we will assume that article 120 is a semiconductor wafer, though this assumption is neither necessary nor limiting. The article is being held by an article holder (end effector) 130 mounted on a robot arm 134. Arm 134 is attached to a robot body 124B which itself may include a number of moving arms. One example of a suitable robot is model GBY7S available from Genmark Automation of Sunnyvale, Calif. The robot is controlled by its computer 140, which in turn may receive commands from, and send information to, a programmable logic controller (PLC) 150. Computer 140 and PLC 150 are software programmable. A device 160 controlled by computer 140 and/or PLC 150 generates a force that draws the wafer 120 to end effector 130. In some embodiments, the wafer is held by gas vortices emitted from the end effector, and device 160 is a gas pump which provides a gas flow for the gas vortices. The invention is not limited to any particular end effector or robot structures or control mechanisms. Other robots and end effectors, known or to be invented, and non-electronically-controlled article handlers, can also be used.

Station 122 can be any station involved in wafer storage or processing. In one embodiment, station 122 is part of a transport device that delivers semiconductor wafers to a plasma processing chamber. See U.S. Pat. No. 6,139,678 issued on Oct. 31, 2000 to O. Siniaguine, entitled "Plasma Processing Methods and Apparatus", incorporated herein by reference. See also U.S. patent application Ser. No. 09/632,236 filed Aug. 4, 2000 by S. Casarotti et al., entitled "Detection and Handling of Semiconductor Wafers and Wafer-Like Objects", incorporated herein by reference. The invention is not limited to a particular structure or function of the target station.

Figure 2:
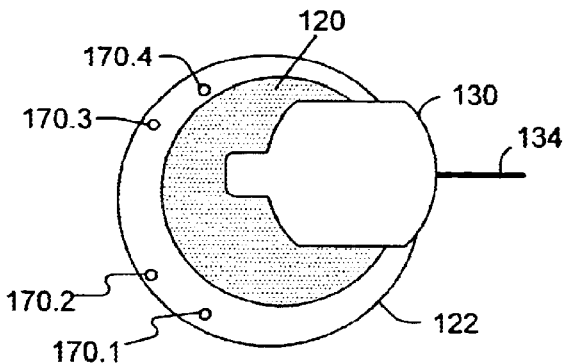
FIGS. 2–7 are top views of article handling systems according to some embodiments of the present invention.

Wafer 120 is round in plan view. Target station 122 has pins 170.1, 170.2, 170.3, 170.4 positioned thereon along a circle approximating the contour of wafer 120. When the end effector 130 approaches the target station, the position of the end effector relative to the target station may deviate from an ideal position as illustrated in FIG. 2. In the embodiment being described, the end effector should ideally be positioned symmetrically with respect to pins 170, and wafer 120 should also be in a position symmetric with respect to pins 170 and to the end effector. In FIG. 2, both the wafer and the end effector are shifted sidewise (up in the top view of FIG. 2) from their ideal position relative to the pins, and the wafer is shifted down (in the top view) relative to the end effector. FIG. 2 does not illustrate all of the possible errors that may occur in the wafer and end effector positioning.

Figure 3:
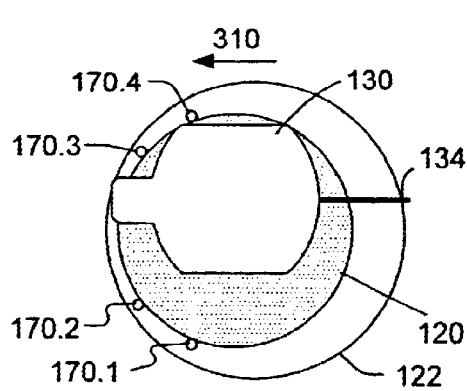

As shown in FIG. 3, the end effector moves to the left, in the direction of arrow 310, to some predefined position proximate to pins 170. The final position of the end effector deviates from the ideal position symmetric with respect to the pins. As the end effector is moving, the wafer comes in contact with pins 170, and the pins steer the wafer into a circular area defined by the pins' position and the wafer radius. The wafer position is now precise relative to the pins, even though the wafer position relative to the end effector may be erroneous.

The end effector does not come in contact with pins 170 in some embodiments.

When the pins 170 steer the wafer, the wafer slides relative to the end effector without the end effector losing hold of the wafer. Suitable end effectors are described in detail below.

Figure 4:
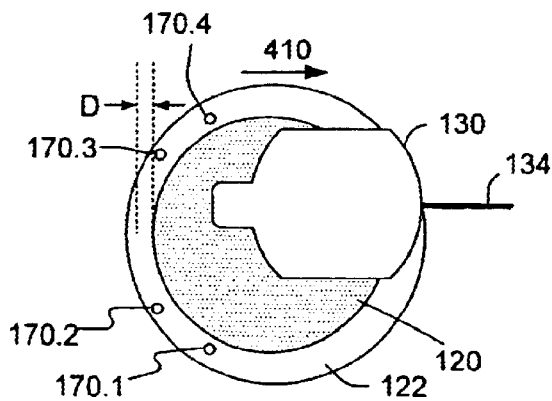

As shown in FIG. 4, the robot now moves the end effector to the right, away from the pins, in the direction of arrow 410. The end effector moves by some predetermined distance D defined by control circuitry (e.g. computer 140 and/or PLC 150). Consequently, the wafer moves by distance D to the right. The wafer remains precisely positioned relative to pins 170 even though the end effector may be positioned imprecisely.

Then the end effector lowers the wafer onto the target station and releases the wafer.

In some embodiments, the step of FIG. 4 is omitted. The wafer is lowered onto the target station immediately after the step of FIG. 3.

Precise wafer positioning is especially important for thin wafers (e.g. 100 μm or thinner) because they are fragile and can be easily damaged. Such wafers can be easily mispositioned when being picked up by the end effector because they sag under their own weight and because they can be warped by internal stresses induced by the simultaneous presence in the wafer of different materials (semiconductor materials, metals, dielectrics) that constitute the wafer circuitry. The invention is not limited to thin or deformed wafers however.

Some embodiments handle semiconductor wafers which have a flat side portion (a "flat") used for rotational alignment. The distance between the adjacent pins 170 is chosen to be larger than the length of the flat.

The invention is not limited to any particular shape or size of end effector 130 or wafer 120. In some embodiments, the wafer protrudes from the end effector by at most a few millimeters. The end effector may be round in top view or have some other shape.

Figure 5:
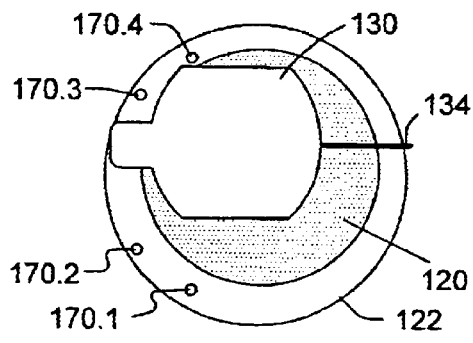

FIG. 5 illustrates a case in which the wafer positioning technique of FIG. 3 may fail. The end effector is positioned as in FIG. 3, but the wafer does not touch the pins 170 because the wafer is shifted too far right relative to the end effector. This may happen due to an error which occurred when the wafer was picked up. Small errors of this type may be tolerable depending on the particular system, while larger errors may be not. Larger errors can be avoided in a number of ways. In some embodiments, when the end effector picks up the wafer, the end effector is operated so that any possible positioning errors would result in the wafer being shifted too far towards pins 170 at the stage of FIG. 3, not away from the pins.

In another embodiment, station 122 has pins 610 (FIG. 6) provided thereon to shift the wafer left. Before the stage of FIG. 3, the end effector is positioned so that the pins 610 are between the end effector and the robot body 124B. The robot moves the end effector towards pins 610, in the direction of arrow 620. If wafer 120 projects beyond the end effector in the direction of the robot's body by more than a predetermined distance, the wafer 120 will come in contact with pins 610 and will slide left relative to the end effector. Then the steps of FIG. 3 and possibly FIG. 4 are performed.

Some embodiments have more or fewer than four pins 170, and may have any number of pins 610. Two pins 170 are sufficient for precise positioning of a round article having a predefined radius. If the article is a round wafer having a flat or a notch on its periphery, three pins 170 are sufficient if the distance between the adjacent pins 170 is larger than the length or the flat or the notch. Two pins 170 may be insufficient because one of the pins may come against the flat or the notch during the operation of FIG. 3. Four pins 170 may be desirable depending on the maximum positioning error at the stage of FIG. 2. For example, suppose in FIGS. 2, 3, pin 170.4 is omitted. Suppose that at the stage of FIG. 2, the center of wafer 120 is above the pin 170.3 (in top view). Then at the stage of FIG. 3 the pin 170.3 will push the wafer up, and the wafer will not contact the pins 170.1, 170.2. More than four pins 170 can be provided. Similar considerations apply to pins 610.

In some embodiments, only one pin 170 and/or only one pin 610 is provided. The article positioning may be imprecise, but the positioning errors are tolerable.

The invention is not limited to a particular position of pins 170 or 610 relative to station 122 or each other. Pins 170 can be positioned on some other side of station 122 and not necessarily on the side opposite to the robot's body as in FIG. 1. Pins 610 may also be positioned differently than in FIG. 6. Pins 170, 610 do not have to be part of station 122, they can be at a distance from the station.

In some embodiments, pins 610 are omitted, and their function is performed by one or more of pins 170. For example, the end effector positions the wafer to the left of pins 170, and moves the wafer right. Pins 170.2, 170.3 steer the wafer left. Then the stage of FIG. 3 is performed.

The invention is not limited to articles being positioned on top of station 122. Station 122 may be a wafer storage cassette such as described in the aforementioned U.S. patent application Ser. No. 09/632,236. Wafers are inserted into the cassette horizontally as the end effector moved horizontally. Pins 170 and/or 610 can be mounted on top of the cassette or at some other place. Other stations and wafer placement techniques, known or to be invented, can be used.

Figure 7:
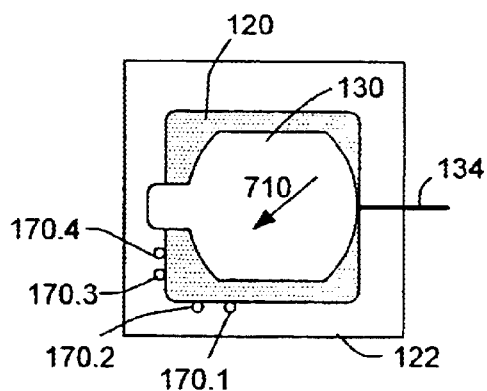

As noted above, the invention is not limited to any particular shape of article 120. In FIG. 7, the article is rectangular. It can be a flat panel display for example. Pins 170.1, 170.2 are positioned along one side of the article, and pins 170.3, 170.4 are positioned along an adjacent side of the article. To bring the article in contact with the pins, the robot moves the article diagonally, in the direction of arrow 710. Alternatively, the robot may move the article to the left to push the article against pins 170.3, 170.4, then right, then down (in the view of FIG. 7) to push the article against the pins 170.1, 170.2, then up. Then the article is placed onto or into station 122.

Objects other than pins can also be used. For example, one or more of pins 170, 610 can be replaced with a vertical wall having a circular surface against which a circular article can be pushed at the stage of FIG. 3. Multiple walls can be used. The pins or other pin positioning objects do not have to be vertical, and may have any shape and orientation.

Figure 8:
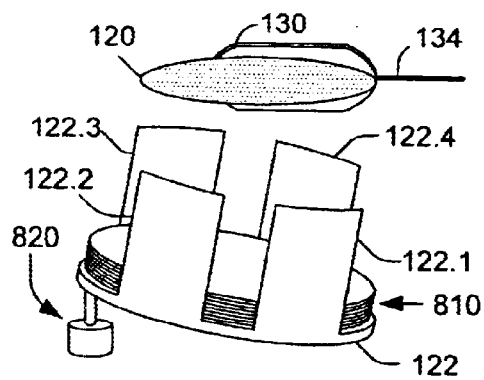
FIG. 8 is a perspective view of an article handling system according to one embodiment of the present invention.

In FIG. 8, target station 122 is a horizontal wafer shipment container (a "pod"). The pod stores a stack 810 of semiconductor wafers separated by paper or plastic inserts. Foam is provided at the top and bottom of the stack. See U.S. patent application Ser. No. 10/071,689 filed by F. E. Kretz et al. on Jul. 13, 2001, entitled "Article Holders with Sensors Detecting a Type of Article Held by the Holder", incorporated herein by reference. The pod has walls 122.1, 122.2, 122.3, 122.4 around the wafer/paper/foam stack 810. The end effector pushes the article against the walls 122.2, 122.3 as in FIG. 3, then optionally moves the article to the left as in FIG. 4, then lowers the article into the pod. The pod is tilted by a pneumatic device 820 inserted under the pod near the walls 122.2, 122.3. The tilt allows the article to travel above the walls 122.1, 122.4 when the article is being pushed horizontally against the walls 122.2, 122.3. Device 820 can be replaced by a non-pneumatic device, or block or a wedge, or some other tilting means, known or to be invented.

In some embodiments, the pod is not tilted. In some embodiments, the robot tilts the end effector so that the end effector moves at an angle relative to the pod when the end effector pushes the wafer against the walls 122.2, 122.3. Also, walls other than 122.2, 122.3 can be used for wafer positioning. Some of the walls can perform the function of pins 610 (FIG. 6).

Figure 6:
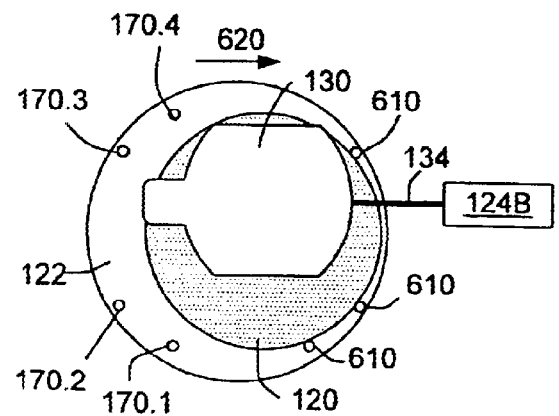

In some embodiments, the positioning steps of FIGS. 3, 4, 6 are omitted for the embodiment of FIG. 8 when the end effector places paper or foam in the pod because the paper and foam are less likely to be damaged by imprecise positioning relative to the pod.

Figure 9:
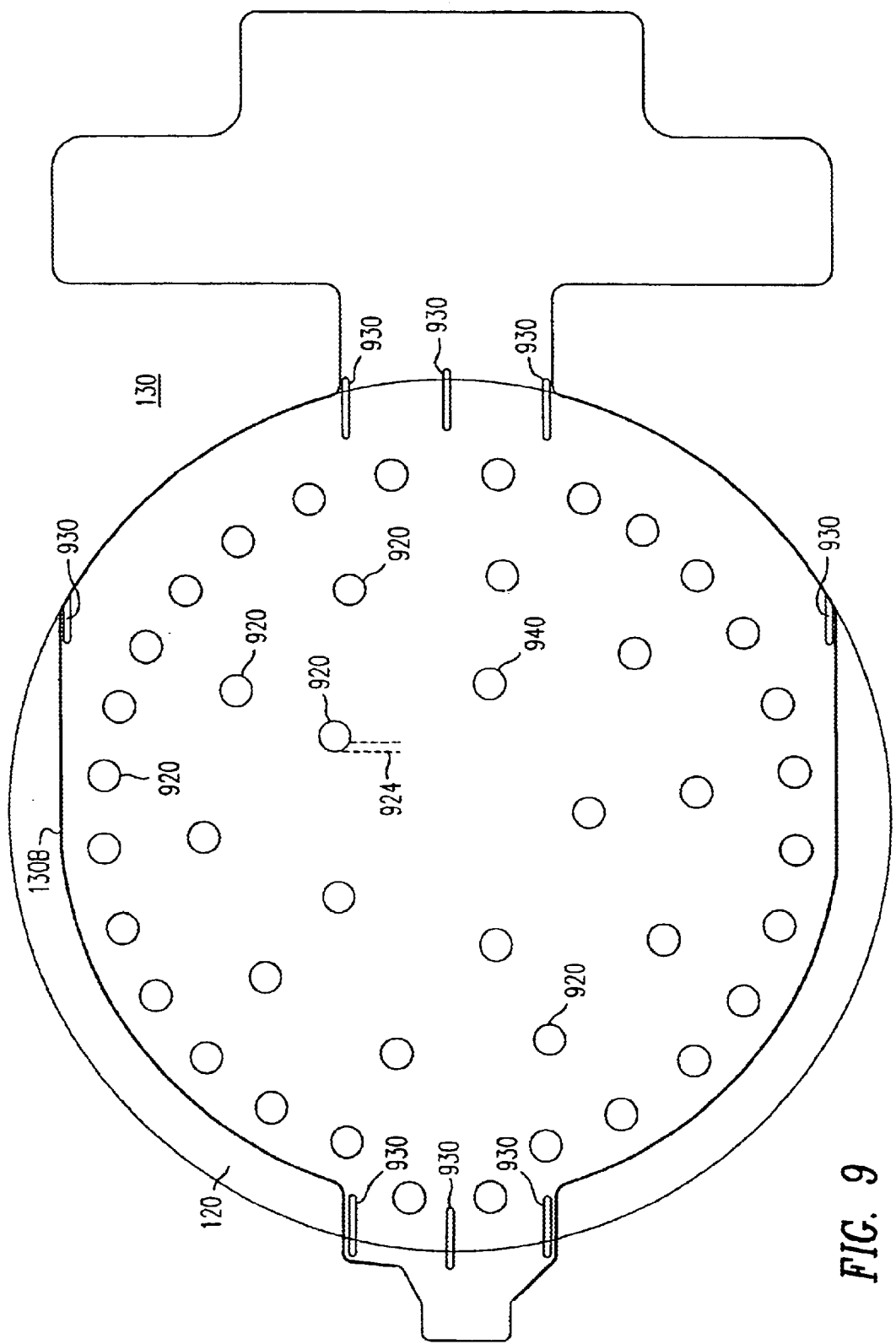
FIG. 9 is a bottom view of an end effector according to one embodiment of the present invention.

FIG. 9 is a bottom view of an end effector that allows the wafer to slide while holding the wafer. The end effector is a non-contact type, described in detail in the aforementioned U.S. patent application Ser. No. 10/071,689. It holds articles with gas vortices emitted from openings 920 in its flat bottom surface. Only a few of the openings are labeled in the drawings. Gas vortex end effectors are described in U.S. Pat. No. 6,095,582 issued Aug. 1, 2000 to Siniaguine et al. and incorporated herein by reference. See also U.S. patent application Ser. No. 09/632,236 filed Aug. 4, 2000 by S. Casarotti et al.; U.S. patent application Ser. No. 09/633,086 filed Aug. 4, 2000 by S. Kao (now U.S. Pat. No. 6,427,991 B1); U.S. patent application Ser. No. 09/877,366 entitled "Article Holders That Use Gas Vortices To Hold An Article In A Desired Position", filed Jun. 8, 2001 by S. Kao. Numeral 120 denotes a contour of an article (wafer, paper or foam) held in the end effector. In an exemplary embodiment, the end effector has a body 130B made of a top plate and a bottom plate. A number of vortex chucks are positioned in a hollow region (not shown) between the two plates. Each opening 920 is an opening of one such chuck. A tangential passage 924 goes through a vertical cylindrical wall of each chuck. Gas is supplied under pressure, by pump 160 (FIG. 1) into the hollow region between the plates of the end effector. The high pressure forces the gas to enter the vortex chucks through passages 924 and form gas vortices. The gas vortices emerge from openings 920 and create an attraction force that holds the wafer, paper, or foam article near the body of the end effector. The gas also creates a cushion that prevents the article from touching the bottom surface of the end effector except at brake pads 930. Brake pads 930 protrude from the bottom surface of the end effector. See the side view in FIG. 10. The article is pressed against the brake pads by the attraction force of the gas vortices.

The invention is not limited to gas vortex end effectors or end effectors made of two plates.

Friction between article 120 and brake pads 930 prevents the article from sliding horizontally when the end effector carries the article from one station to another. The friction force is small enough however to allow the article to slide when the article is being pushed against pins 170 or 610. In some embodiments, the friction force is varied by varying the gas flow through openings 920. During the steps of FIGS. 3 and 6, when the article is being pushed against the pins, the gas flow is reduced so that the friction force is lowered. For example, in one semiconductor wafer embodiment, the gas flow is normally about 50–240 slpm (standard liters per minute) for wafers weighing about 50 to 250 g. The break pads are 0.25 mm to 1.5 mm high. At the stage of FIG. 3 or 6, when the end effector is about to move the wafer towards pins 170 or 610, the gas flow is reduced to about 15–120 slpm. The attraction force acting on the wafer is reduced by a value exceeding 10% of the wafer weight. When the stage of FIG. 3 or 6 is completed, the gas flow may optionally be increased again.

Figure 10:
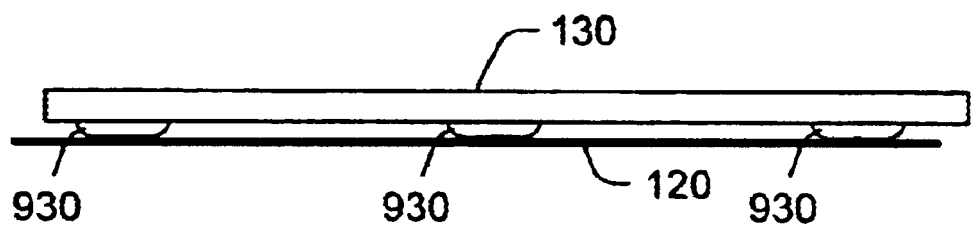
FIG. 10 is a side view of an end effector holding an article according to one embodiment of the present invention.

FIG. 10 is a side view of end effector 130 holding a wafer 120. Only three brake pads are shown. In this embodiment, each pad 930 has a rounded bottom surface to avoid wafer damage when the wafer is pushed against the pins 170 or 610. The brake pads can be made of a smooth material, e.g. plastic. In some embodiments designed to handle semiconductor wafers whose top surface has been passivated with silicon nitride or silicon dioxide, the brake pads are made of plastic, for example, ABS or Kynar.

In the embodiment of FIG. 9, the article physically contacts the end effector only at the brake pads. The invention is not limited to such embodiments. The end effector may have limiter pins extending vertically around the wafer to limit the lateral wafer motion. For example, limiter pins may be provided on the side of the robot's arm 134 (opposite from pins 170) in the view of FIG. 3.

In FIG. 9, the brake pads are elongated from left to right. The invention is not limited to any particular shape or number of brake pads 930. The brake pads can be positioned in the middle of the end effector. They can form continuous lines on the bottom surface of the end effector.

In FIG. 10, the bottom surface of the end effector is flat, and so is the top surface of article 120. The break pads are of a uniform height. These features do not limit the invention.

The invention is not limited to gas vortex end effectors. In some embodiments, the end effector holds articles with non-vortex gas flows by using the Bernoulli effect. Vacuum may also be used. For example, openings may be provided in the end effector's bottom surface to draw air into the end effector's body and create vacuum between the end effector and the article. The openings may be surrounded by a continuous brake pad rim so that when the article slides relative to the end effector, the article continually contacts the rim along the whole length of the rim so as not to brake the vacuum. Different rims may be provided around different openings. The vacuum may be broken at some of the openings but not at others. An end effector may hold articles using electrostatic or magnetic forces, or using a mechanical clamp. In some embodiments, the electrostatic or magnetic forces are reduced, or the mechanical clamp is loosened, when the article is pushed against the pins 170 or 610.

The invention can be applied to achieve precise positioning of the article relative to the end effector. For example, if the end effector can be positioned precisely relative to pins 170 or 610, but the article's position is imprecise, then the steps of FIG. 3 and/or FIG. 6 may position the article precisely relative to the pins and hence relative to the end effector.

FIG. 9 illustrates a teaching hole 940 formed through the end effector body 130B. The teaching hole is used to train the robot to a desired position. For example, if the end effector must place wafers on a platform of a film frame machine which attaches adhesive film frames to wafers, or on a platform of some other station, a mark (e.g. a cross "X") can be made on the platform, and the end effector can be manipulated to a position in which a human operator can see the mark through the teaching hole (with a naked eye or an optical instrument). Then the robot can be caused to remember that position. The invention is not limited to teaching holes.

In some embodiments, the article is positioned above the end effector. The end effector and the article can also occupy a non-horizontal position. Other embodiments and variations are within the scope of the invention, as defined by the appended claims.

What is claimed is:

1. An article holder comprising:
   a first surface which is not to contact an article held by the holder;
   one or more protrusions protruding from the first surface, at least one of the one or more protrusions contacting the article held by the holder; and
   a first mechanism for drawing the article towards the first surface and pressing the article against the one or more protrusions to hold the article in a position opposite to the first surface and to impede the article sliding on the one or more protrusions, the first mechanism being operable to allow the article held in the holder to slide on the one or more protrusions while the first mechanism presses the article against the one or more protrusions and impedes the article sliding, each of the one or more protrusions having a surface which is to contact the article, wherein at least part of the surface for contacting the article is rounded.

2. The article holder of claim 1 wherein each protrusion's entire surface for contacting the article is rounded.

3. The article holder of claim 1 wherein each protrusion is made of plastic.

4. The article holder of claim 1 wherein the article is not to contact the holder except at the one or more protrusions.

5. The article holder of claim 1 wherein the first mechanism comprises one or more gas outlets for emitting gas towards the article.

6. The article holder of claim 1 wherein the first mechanism comprises one or more vortex chambers for emitting gas vortices towards the article.

7. The article holder of claim 1 in combination with a control mechanism for controlling a force drawing the article towards the first surface, wherein the control mechanism comprises a mechanism for:

moving the article holder into a first position as the first mechanism is drawing the article towards the first surface;

reducing the force that draws the article towards the first surface, and moving the holder into a second position as the first mechanism draws the article towards the first surface with a reduced force.

8. The article holder of claim 7 wherein the control mechanism controls a gas flow which generates the force drawing the article towards the first surface, wherein the as flow is to flow towards the article from the first surface.

9. The article holder of claim 1 wherein the article is a semiconductor wafer.

10. A method for handling a semiconductor wafer by a robot controlled by computer circuitry, the method comprising:

the robot picking up the wafer with an end effector; and with the wafer protruding from the end effector, the robot pushing the wafer against one or more objects so as to change the position of the wafer relative to the end effector while the end effector is holding the wafer, the one or more objects steering the wafer into an area defined without a reference to the position of the end effector, the end effector being allowed to be in any one of a plurality of positions relative to said area when the wafer is occupying said area.

11. The method of claim 10 wherein the end effector holds the wafer with an attraction force generated by one or more gas flows, and the end effector includes a first surface and at least one protrusion which protrudes from the first surface and contacts the wafer and impedes a movement of the wafer relative to the end effector, and the wafer slides on the surface of the protrusion along the first surface without contacting the first surface when the wafer is pushed against the one or more objects.

12. The method of claim 11 wherein the one or more gas flows are emitted from the end effector towards the wafer.

13. The method of claim 12 wherein each of the one or more gas flows is a gas vortex.

14. The method of claim 10 wherein to hold the wafer by the end effector, the robot generates an attraction force that draws the wafer to the end effector;

the method further comprising reducing but not eliminating the attraction force generated by the robot when the robot is pushing the wafer against the one or more objects.

15. The method of claim 10 further comprising, after pushing the wafer, the robot placing the wafer into a position which is a predetermined position relative to the one or more objects, and the robot releasing the article in said predetermined position.

16. A computer readable medium comprising computer instructions for controlling a robot to perform the operations of claim 10.

17. The method of claim 10 further comprising:

the robot generating an attraction force that draws the article to the robot's end effector, the end effector holding the article with the attraction force; and with the article protruding from the end effector, the robot reducing, but not eliminating the attraction force and pushing the article against one or more objects so as to change the position of the article relative to the end effector while the end effector is holding the article.

18. A computer readable medium comprising computer instructions for controlling a robot to perform the operations of claim 17.

19. The article holder of claim 1 wherein the first surface is substantially planar, and the article is to be held in a position extending along the first surface.

20. The method of claim 10 wherein said area has a predetermined position relative to the one or more objects.

21. The method of claim 20 wherein said area is defined by the position of the one or more objects and a geometry of the wafer.

22. The method of claim 20 wherein after the pushing operation, the robot releases the wafer at a target station, wherein the one or more objects are in a predetermined position relative to the target station.

23. The method of claim 10 wherein after the pushing operation, the robot releases the wafer at a target station, wherein the one or more objects are in a predetermined position relative to the target station.

24. An article holder comprising:

a first surface which is not to contact an article held by the holder;

one or more protrusions protruding from the first surface, at least one of the one or more protrusions contacting the article held by the holder; and a first mechanism for drawing the article towards the first surface and pressing the article against the one or more protrusions to hold the article in any one of a plurality of positions relative to the first surface, said positions being opposite to the first surface, said positions being shifted relative to each other, each of the one or more protrusions having a surface which is to contact the article in at least one of said positions, wherein at least part of the surface for contacting the article is rounded;

wherein the article is not to contact the holder except at the one or more protrusions.

25. The article holder of claim 24 wherein each protrusion is made of plastic.

26. An article holder comprising:

a first surface which is not to contact an article held by the holder;

one or more protrusions protruding from the first surface, at least one of the one or more protrusions contacting the article held by the holder; and a first mechanism for drawing the article towards the first surface and pressing the article against the one or more protrusions to hold the article in any one of a plurality of positions relative to the first surface, said positions being opposite to the first surface, said positions being shifted relative to each other, each of the one or more protrusions having a surface which is to contact the article in at least one of said positions, wherein at least part of the surface for contacting the article is rounded;

wherein the first mechanism comprises one or more gas outlets for emitting gas towards the article.

27. The article holder of claim 26 wherein each protrusion's entire surface for contacting the article is rounded.

28. An article holder comprising:

a first surface which is not to contact an article held by the holder;

one or more protrusions protruding from the first surface, at least one of the one or more protrusions contacting the article held by the holder; and a first mechanism for drawing the article towards the first surface and pressing the article against the one or more protrusions to hold the article in any one of a plurality of positions relative to the first surface, said positions being opposite to the first surface, said positions being shifted relative to each other, each of the one or more protrusions having a surface which is to contact the article in at least one of said positions, wherein at least part of the surface for contacting the article is rounded;

wherein the first mechanism comprises one or more vortex chambers for emitting gas vortices towards the article.

29. An apparatus comprising:

(1) an article holder comprising:

a first surface which is not to contact an article held by the holder;

one or more protrusions protruding from the first surface, at least one of the one or more protrusions contacting the article held by the holder; and a first mechanism for drawing the article towards the first surface and pressing the article against the one or more protrusions to hold the article in any one of a plurality of positions relative to the first surface, said positions being opposite to the first surface, said positions being shifted relative to each other, each of the one or more protrusions having a surface which is to contact the article in at least one of said positions, wherein at least part of the surface for contacting the article is rounded;

(2) a control mechanism for controlling a force drawing the article towards the first surface, wherein the control mechanism comprises a mechanism for:

moving the article holder into a first position as the first mechanism is drawing the article towards the first surface;

reducing the force that draws the article towards the first surface, and moving the holder into a second position as the first mechanism draws the article towards the first surface with a reduced force.

30. The apparatus of claim 29 wherein the control mechanism controls a gas flow which generates the force drawing the article towards the first surface, wherein the gas flow is to flow towards the article from the first surface.

31. The apparatus of claim 29 wherein the article is a semiconductor wafer.

32. A method for transporting an article, the method comprising:

emitting one or more gas flows from a first surface towards the article to generate a force drawing the article towards the first surface and pressing a planar surface of the article against one or more protrusions protruding from the first surface, the article being at a distance from the first surface, at least one of the protrusions having a surface contacting the article, wherein at least part of the protrusion's surface contacting the article is rounded.

33. The method of claim 32 wherein a plurality of the protrusions contact the article, and all of each protrusion's surface contacting the article is rounded.

34. The method of claim 32 further comprising reducing but not eliminating the force drawing the article towards the first surface, and allowing the article to slide on the protrusions while being pressed against the protrusions.

35. The method of claim 32 wherein each gas flow is a gas vortex.

* * * * *